(12) United States Patent
Adachi et al.

(10) Patent No.: US 8,237,242 B2
(45) Date of Patent: Aug. 7, 2012

(54) CAPACITOR, METHOD OF PRODUCING THE SAME, SEMICONDUCTOR DEVICE, AND LIQUID CRYSTAL DISPLAY DEVICE

(75) Inventors: Kiwamu Adachi, Kanagawa (JP); Satoshi Horiuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 45 days.

(21) Appl. No.: 11/880,551

(22) Filed: Jul. 23, 2007

(65) Prior Publication Data

US 2008/0029764 A1 Feb. 7, 2008

(30) Foreign Application Priority Data

Aug. 3, 2006 (JP) .................... 2006-212062
Oct. 4, 2006 (JP) .................... 2006-273029
Jan. 24, 2007 (JP) .................... 2007-013811

(51) Int. Cl.
*H01L 29/92* (2006.01)
(52) U.S. Cl. .. 257/532; 257/310; 257/535; 257/E29.343
(58) Field of Classification Search ............... 257/310, 257/528, 532, 535, E27.071, E29.343
See application file for complete search history.

(56) References Cited

U.S. PATENT DOCUMENTS

| 7,091,548 B2 * | 8/2006 | Jeong et al. ............ 257/310 |
| 2005/0082595 A1 * | 4/2005 | Lee et al. ............ 257/310 |
| 2006/0146477 A1 * | 7/2006 | Kim et al. ............ 361/311 |

FOREIGN PATENT DOCUMENTS

| JP | 2004-79687 A | 3/2004 |
| JP | 2004-165559 | 6/2004 |
| JP | 2005-064522 | 10/2005 |

OTHER PUBLICATIONS

Ishikawa et al., "High-Capacitance Cu/Ta2O5/Cu MIM Structure for SoC Application Featuring a Single-Mask Add-on Process", Central Research Lab., Hitachi Ltd., Tokyo, IEDM (2002).
Hu et al., "High performance ALD HfO2-Al2O3 Laminate MIM Capacitors for RF and Mixed Signal IC Applications", IEDM (2003).
Ding et al., "RF, DC and Reliability Characteristics ALD HfO2-Al2O3 Laminate MIM Capacitors for Si RF IC Applications", IEEE Trans- Electron Devices, Vo1. 51, No. 6, Jun. 2004.
Ding et al., "Evidence and Understanding of ALD HfO2-Al2O3 Laminate MIM Capacitors Outperforming Sandwich Counterparts", EEE Electron Devices Letters, vol. 25, No. 10, Oct. 2004.
Robert et.al., Application-of-On- Chi p-MIM-Decoupling Capacitor for 90nm SOIMicroprocessor11, Electron Devices Meeting, 2005. IEDM Technical Digest. IEEE.

* cited by examiner

*Primary Examiner* — Jerome Jackson, Jr.
*Assistant Examiner* — Yu Chen
(74) *Attorney, Agent, or Firm* — Robert J. Depke; Rockey, Depke & Lyons, LLC

(57) ABSTRACT

A capacitor includes a first electrode, a dielectric layer, and a second electrode that are sequentially stacked. The dielectric layer has a stacked layer structure including a predetermined number of hafnium oxide sublayers and predetermined number of tantalum oxide sublayers. The number, materials, and thicknesses of the sublayers are determined so that the thickness ratio has a range in which, in voltage-leakage current characteristics showing the relationship between the voltage between the first and second electrodes and the leakage current, a start voltage at which the slope of an increase in the current starts to discontinuously increase satisfies an electric field strength of 3 [MV/cm] or more when the ratio of the total thickness of the predetermined number of tantalum oxide sublayers to the total thickness of the dielectric layer is varied, and the thickness ratio is within the range such that the start voltage is within the range.

5 Claims, 12 Drawing Sheets

3t, 3b: HfO₂ SUBLAYER 3t, 3b: HfO₂ SUBLAYER

FIG. 5

LAYER THICKNESS (nm)

| ε<br>Cdens | 20 | 22 | 24 | 26 | 28 | 30 |
|---|---|---|---|---|---|---|
| 6 | 29.51333 | 32.46467 | 35.416 | 36.36733 | 41.31867 | 44.27 |
| 7 | 25.29714 | 27.82686 | 30.35657 | 32.88629 | 35.416 | 37.94571 |
| 8 | 22.135 | 24.3485 | 26.562 | 28.7755 | 30.989 | 33.2025 |
| 9 | 19.67556 | 21.64311 | 23.61067 | 25.57822 | 27.54578 | 29.51333 |
| 10 | 17.708 | 19.4788 | 21.2496 | 23.0204 | 24.7912 | 26.562 |
| 11 | 16.09818 | 17.708 | 19.31782 | 20.92764 | 22.53745 | 24.14727 |
| 12 | 14.75667 | 16.23233 | 17.708 | 19.18367 | 20.65933 | 22.135 |

ELECTRIC FIELD (MV/cm)  @3.3v

| Cdens \ ε | 20 | 22 | 24 | 26 | 28 | 30 |
|---|---|---|---|---|---|---|
| 6 | 1.12 | 1.02 | 0.93 | 0.86 | 0.80 | 0.75 |
| 7 | 1.30 | 1.19 | 1.09 | 1.00 | 0.93 | 0.87 |
| 8 | 1.49 | 1.36 | 1.24 | 1.15 | 1.06 | 0.99 |
| 9 | 1.68 | 1.52 | 1.40 | 1.29 | 1.20 | 1.12 |
| 10 | 1.86 | 1.69 | 1.55 | 1.43 | 1.33 | 1.24 |
| 11 | 2.05 | 1.86 | 1.71 | 1.58 | 1.46 | 1.37 |
| 12 | 2.24 | 2.03 | 1.86 | 1.72 | 1.60 | 1.49 | fF/μm²

FIG. 6B

ELECTRIC FIELD (MV/cm)  @5v

| Cdens \ ε | 20 | 22 | 24 | 26 | 28 | 30 |
|---|---|---|---|---|---|---|
| 6 | 1.69 | 1.54 | 1.41 | 1.30 | 1.21 | 1.13 |
| 7 | 1.98 | 1.80 | 1.65 | 1.52 | 1.41 | 1.32 |
| 8 | 2.26 | 2.05 | 1.88 | 1.74 | 1.61 | 1.51 |
| 9 | 2.54 | 2.31 | 2.12 | 1.95 | 1.82 | 1.69 |
| 10 | 2.82 | 2.57 | 2.35 | 2.17 | 2.02 | 1.88 |
| 11 | 3.11 | 2.82 | 2.59 | 2.39 | 2.22 | 2.07 |
| 12 | 3.39 | 3.08 | 2.82 | 2.61 | 2.42 | 2.26 | fF/μm²

FIG. 6C

ELECTRIC FIELD (MV/cm)  @6.6v

| Cdens \ ε | 20 | 22 | 24 | 26 | 28 | 30 |
|---|---|---|---|---|---|---|
| 6 | 2.24 | 2.03 | 1.86 | 1.72 | 1.60 | 1.49 |
| 7 | 2.61 | 2.37 | 2.17 | 2.01 | 1.86 | 1.74 |
| 8 | 2.98 | 2.71 | 2.48 | 2.29 | 2.13 | 1.99 |
| 9 | 3.35 | 3.05 | 2.80 | 2.58 | 2.40 | 2.24 |
| 10 | 3.73 | 3.39 | 3.11 | 2.87 | 2.66 | 2.48 |
| 11 | 4.10 | 3.73 | 3.42 | 3.15 | 2.93 | 2.73 |
| 12 | 4.47 | 4.07 | 3.73 | 3.44 | 3.19 | 2.98 | fF/μm²

FIG. 6D

ELECTRIC FIELD (MV/cm) @7v

| Cdens \ ε | 20 | 22 | 24 | 26 | 28 | 30 |
|---|---|---|---|---|---|---|
| 6 | 2.37 | 2.16 | 1.98 | 1.82 | 1.69 | 1.58 |
| 7 | 2.77 | 2.52 | 2.31 | 2.13 | 1.98 | 1.84 |
| 8 | 3.16 | 2.87 | 2.64 | 2.43 | 2.26 | 2.11 |
| 9 | 3.56 | 3.23 | 2.96 | 2.74 | 2.54 | 2.37 |
| 10 | 3.95 | 3.59 | 3.29 | 3.04 | 3.11 | 2.90 |
| 11 | 4.35 | 3.95 | 3.62 | 3.34 | 3.11 | 2.90 |
| 12 | 4.74 | 4.31 | 3.95 | 3.65 | 3.39 | 3.16 | fF/μm²

FIG. 6E

ELECTRIC FIELD (MV/cm) @13.2v

| Cdens \ ε | 20 | 22 | 24 | 26 | 28 | 30 |
|---|---|---|---|---|---|---|
| 6 | 4.47 | 4.07 | 3.73 | 3.44 | 3.19 | 2.98 |
| 7 | 5.22 | 4.74 | 4.35 | 4.01 | 3.73 | 3.48 |
| 8 | 5.96 | 5.42 | 4.97 | 4.59 | 4.26 | 3.98 |
| 9 | 6.71 | 6.10 | 5.59 | 5.16 | 4.79 | 4.47 |
| 10 | 7.45 | 6.78 | 6.21 | 5.73 | 5.32 | 4.97 |
| 11 | 8.20 | 7.45 | 6.83 | 6.31 | 5.83 | 5.47 |
| 12 | 8.95 | 8.13 | 7.45 | 6.88 | 6.39 | 5.96 | fF/μm²

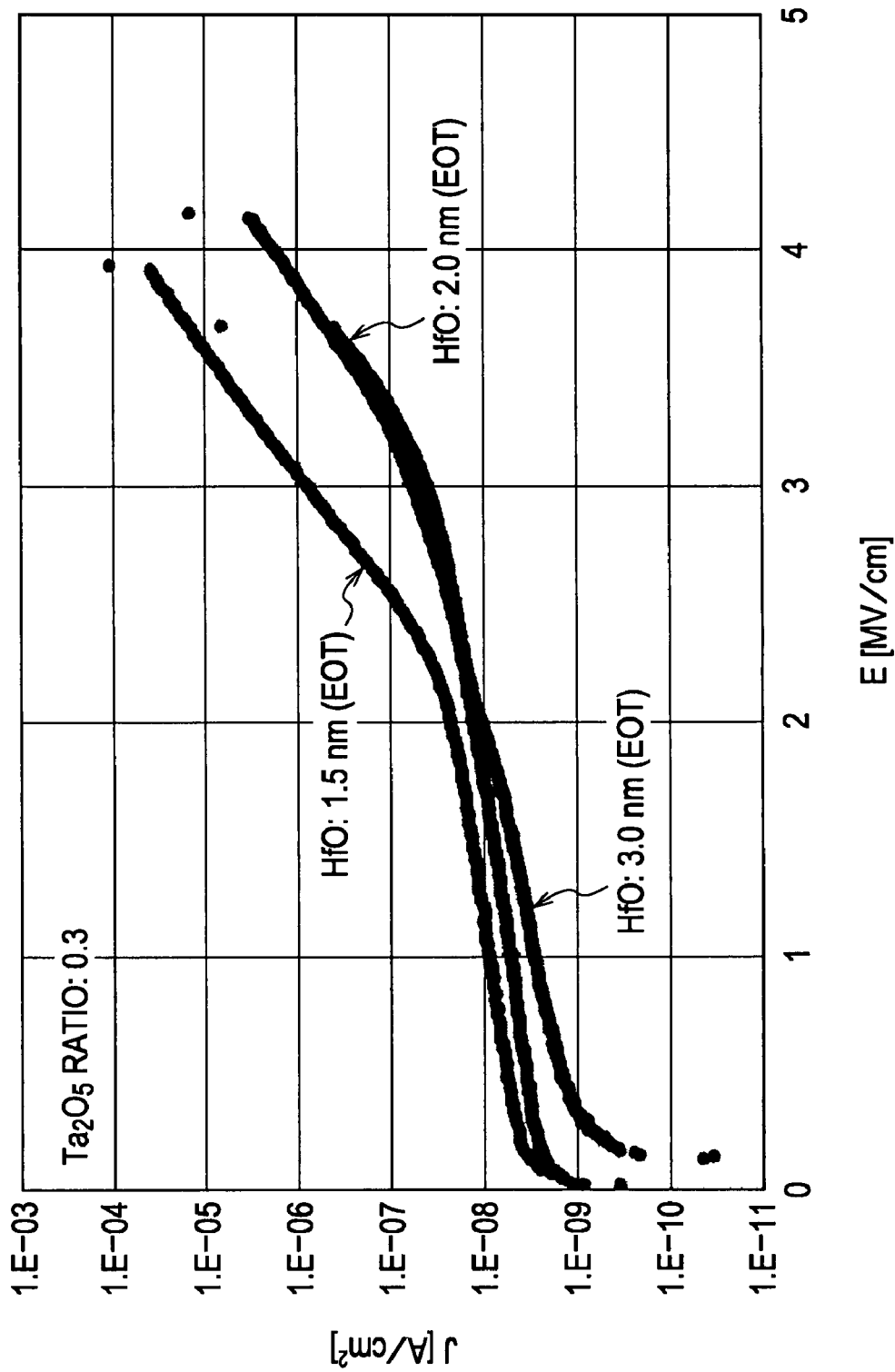

CAPACITOR, METHOD OF PRODUCING THE SAME, SEMICONDUCTOR DEVICE, AND LIQUID CRYSTAL DISPLAY DEVICE

CROSS REFERENCES TO RELATED APPLICATIONS

The present invention contains subject matter related to Japanese Patent Application JP 2006-212062 filed in the Japanese Patent Office on Aug. 3, 2006, Japanese Patent Application JP 2006-273029 filed in the Japanese Patent Office on Oct. 4, 2006, and Japanese Patent Application JP 2007-013811 filed in the Japanese Patent Office on Jan. 24, 2007, the entire contents of which are incorporated herein by reference.

BACKGROUND OF THE INVENTION

1. Field of the Invention

The present invention relates to a capacitor in which a first electrode, a dielectric layer having a stacked layer structure including a plurality of sublayers, and a second electrode are sequentially stacked, a method of producing the capacitor, and a semiconductor device and a liquid crystal display device that include the capacitor.

2. Description of the Related Art

As a technique for increasing the capacitance of a metal-insulator-metal (MIM) capacitor, a capacitor including $Ta_2O_5$, which has a high relative dielectric constant, has been studied. However, improvement in leakage current characteristics has not been satisfactorily achieved because of the physical properties of $Ta_2O_5$.

Consequently, $HfO_2$, $Al_2O_3$, and stacked layers composed of these compounds whose relative dielectric constants are somewhat low but which have excellent I (current)–V (applied voltage) characteristics have been studied. Furthermore, stacked layer structures each including $Al_2O_3$ or the like having excellent leakage current characteristics and $Ta_2O_5$ having a high relative dielectric constant have also been studied.

A known structure of a dielectric layer of a capacitor is a structure in which a $Ta_2O_5$ sublayer is sandwiched between sublayers made of $Al_2O_3$, which is a currently commonly used material (see, for example, Tsuyoshi Ishikawa et al., "High-Capacitance Cu/$Ta_2O_5$/Cu MIM Structure for SoC Applications Featuring a Single-Mask Add-on Process", IEDM 2002 (hereinafter referred to as "Document 1")).

A capacitor including a dielectric layer having a multilayered structure (laminated structure) composed of a plurality of $HfO_2$ sublayers and $Al_2O_3$ sublayers is also known (see, for example, Hang Hu et al., "High performance ALD $HfO_2$—$Al_2O_3$ Laminate MIM Capacitors for RF and Mixed Signal IC Applications", 2003 IEDM (hereinafter referred to as "Document 2"); Shi-Jin Ding et al., "RF, DC and Reliability Characteristics ALD $HfO_2$—$Al_2O_3$ Laminate MIM Capacitors for Si RF IC Applications", IEEE Trans-Electron devices Vol. 51, No. 6, June 2004 (hereinafter referred to as "Document 3"); and Shi-Jin Ding et al., "Evidence and Understanding of ALD $HfO_2$—$Al_2O_3$ Laminate MIM Capacitors Outperforming Sandwich Counterparts", IEEE Electron devices Letter Vol. 25, No. 10, October 2004 (hereinafter referred to as "Document 4")).

In these capacitor structures, the leakage current characteristics can be improved. In particular, according to Documents 2 and 3, the leakage current density of such structures in a low-voltage range is about $5 \times 10^{-9}$ [$A/cm^2$], thus realizing a satisfactory characteristic.

According to Document 4, a dielectric layer having a stacked layer structure in which sublayers composed of $Al_2O_3$ (1 [nm])-$HfO_2$ (12 [nm])-$Al_2O_3$ (1 [nm]) are repeated is more preferable than a dielectric layer having a stacked layer structure of $Al_2O_3$—$HfO_2$—$Al_2O_3$. The former dielectric layer has preferable characteristics. More specifically, a leakage current density at a low voltage is $1 \times 10^{-9}$ [$A/cm^2$] and a voltage at which the leakage current starts to markedly increase is about 7 [V].

Furthermore, it is known that the leakage current characteristics are improved by laminating a plurality of crystallized $HfO_2$ and $Al_2O_3$ sublayers (see Shi-Jin Ding et al., "Evidence and Understanding of ALD $HfO_2$—$Al_2O_3$ Laminate MIM Capacitors Outperforming Sandwich Counterparts" IEEE EDL Vol. 25, No. 10, October).

In addition, a structure of a dielectric layer of a capacitor in which a $Ta_2O_5$ sublayer is sandwiched between $HfO_2$ sublayers whose leakage current characteristics are improved by adding Si to $HfO_2$ (see, for example, Japanese Unexamined Patent Application Publication No. 2004-79687).

SUMMARY OF THE INVENTION

For example, when the above MIM capacitors are used in a memory device, a logic device, or a specific low-voltage operating device, development for improving the unit capacitance is mainly performed, and the improvement in unit capacitance is satisfactory.

However, when the MIM capacitors are used in a device that is used at a relatively high voltage, for example, an analog device (e.g., RF application) or a mixed signal device, or when the MIM capacitors are used in portions close to external terminals for the convenience of circuit configuration, both breakdown withstand voltage and low leakage current are preferably combined, and a high unit capacitance is also desired. Accordingly, known capacitor structures do not necessarily satisfactorily satisfy all these requirements.

More specifically, in an application to a memory device or a logic device, it is sufficient that a voltage applied to a capacitor of at most 2 [V] is considered. However, in a case of a mixed signal device, a breakdown withstand voltage of normally 3 [V], two times thereof depending on the signal amplitude, or furthermore, about 7 [V] or more including a margin is often necessary.

For example, the above-mentioned capacitors described in Documents 1 and 2 show leakage current characteristics due to a PF conduction mechanism from about 1.7 [MV/cm], and the current density starts to markedly increase. Electrical conduction mechanisms in insulating films are mainly described in terms of Schottky leakage current, Fowler-Nordheim tunnel current (FN current), Poole-Frenkel (PF) current, and the like. The reason why the leakage current flowing in an insulating film starts to markedly increase is that, among these electrical conduction mechanisms, in particular, PF current becomes dominant. Herein, a start voltage at which the leakage current starts to markedly increase is referred to as "PF-current-start voltage". For example, when a unit capacitance of 6 [$fF/\mu m^2$] is aimed for, the PF-current-start voltage is about 5.3 [V], which is effective for a 3 [V] power supply. However, when a voltage of up to 7 [V] or more than 7 [V] is considered, the above-mentioned voltage is not satisfactory.

Furthermore, the unit capacitance of the capacitor described in Document 3 is low; about 3.2 [$fF/\mu m^2$], which is not satisfactory in recent years, in which high-density devices have been desired.

As described above, a lot of attention has been paid to the realization of a high breakdown voltage in combination with a high relative dielectric constant, the pursuit for lower leakage current density, and the realization of a higher unit capacitance. However, in many cases, the structure of the capacitor is complex, it is difficult to control the composition, or any one of the above characteristics may be poor. Accordingly, a high-performance capacitor element suitable for an analog application has not yet been easily formed at low cost.

For example, the use of rare metals such as lanthanoids has been studied as an improvement method. However, this method leads to a high production cost. Furthermore, it is very difficult to control the composition in this improvement method by addition of a rare metal.

It is desirable that the materials of MIM capacitors be as versatile as possible, and that MIM capacitors having a simpler structure be realized.

It is desirable to realize a capacitor having a high unit capacitance and a low leakage current density, and a device including the capacitor.

A capacitor according to an embodiment of the present invention includes a first electrode, a dielectric layer, and a second electrode that are sequentially stacked. In the capacitor, the dielectric layer has a stacked layer structure including a predetermined number of hafnium oxide sublayers and a predetermined number of tantalum oxide sublayers. Furthermore, the number of sublayers, the materials of the sublayers, and the thicknesses of the sublayers in the stacked layer structure are determined so that the ratio of the total thickness of the predetermined number of tantalum oxide sublayers to the total thickness of the dielectric layer has a range in which, in voltage-leakage current characteristics showing the relationship between the voltage applied between the first electrode and the second electrode and the leakage current, a start voltage at which the slope of an increase in the current to an increase in the voltage starts to discontinuously increase as a whole in a voltage range in which the applied voltage is lower than the dielectric breakdown voltage satisfies a condition of an electric field strength of 3 [MV/cm] or more when the ratio of the total thickness of the predetermined number of tantalum oxide sublayers to the total thickness of the dielectric layer in the stacked layer structure is varied, and the ratio of the total thickness of the predetermined number of tantalum oxide sublayers to the total thickness of the dielectric layer is within a thickness ratio range such that the start voltage is within the range.

In the stacked layer structure of the dielectric layer, preferably, a sublayer that is in contact with the first electrode and a sublayer that is in contact with the second electrode are each composed of a hafnium oxide sublayer.

More preferably, the ratio of the total thickness of the predetermined number of tantalum oxide sublayers included in the dielectric layer to the total thickness of the dielectric layer is in the range of 0.05 to 0.45.

Further preferably, the ratio of the total thickness of the predetermined number of tantalum oxide sublayers included in the dielectric layer to the total thickness of the dielectric layer is in the range of 0.2 to 0.45.

Furthermore, each of the hafnium oxide sublayers included in the dielectric layer preferably has a thickness of 1.6 [nm] or more in terms of a thickness determined by converting the hafnium oxide sublayer thickness to a silicon dioxide layer thickness.

The leakage current may be Schottky leakage current, Fowler-Nordheim tunnel current, Poole-Frenkel (PF) current, or a combined current of the preceding currents, and the start voltage may be the lower limit voltage of a voltage range in which the PF current increases and the PF current becomes the dominant component of the leakage current.

A method of producing a capacitor according to an embodiment of the present invention includes the steps of forming a first electrode on an insulating film formed on a substrate; forming, on the first electrode, a dielectric layer having a stacked layer structure including a predetermined number of hafnium oxide sublayers and a predetermined number of tantalum oxide sublayers; and forming a second electrode on the dielectric layer. In the step of forming the dielectric layer, the sublayers constituting the dielectric layer are sequentially formed with materials of the sublayers, the thicknesses of the sublayers, and the number of stacked sublayers that provide a stacked layer structure in which the ratio of the total thickness of the predetermined number of tantalum oxide sublayers to the total thickness of the dielectric layer has a range in which, in voltage-leakage current characteristics showing the relationship between the voltage applied between the first electrode and the second electrode and the leakage current, a start voltage at which the slope of an increase in the current to an increase in the voltage starts to discontinuously increase as a whole in a voltage range in which the applied voltage is lower than the dielectric breakdown voltage satisfies a condition of an electric field strength of 3 [MV/cm] or more when the ratio of the total thickness of the predetermined number of tantalum oxide sublayers to the total thickness of the dielectric layer in the stacked layer structure is varied, and the ratio of the total thickness of the predetermined number of tantalum oxide sublayers to the total thickness of the dielectric layer is within a thickness ratio range such that the start voltage is within the range.

A semiconductor device according to an embodiment of the present invention includes a semiconductor substrate; at least one insulating film provided on the semiconductor substrate; and a capacitor including a first electrode, a dielectric layer, and a second electrode that are sequentially stacked on the insulating film. In the semiconductor device, the dielectric layer has a stacked layer structure including a predetermined number of hafnium oxide sublayers and a predetermined number of tantalum oxide sublayers. Furthermore, in the semiconductor device, the number of sublayers, the materials of the sublayers, and the thicknesses of the sublayers in the stacked layer structure are determined so that the ratio of the total thickness of the predetermined number of tantalum oxide sublayers to the total thickness of the dielectric layer has a range in which, in voltage-leakage current characteristics showing the relationship between the voltage applied between the first electrode and the second electrode and the leakage current, a start voltage at which the slope of an increase in the current to an increase in the voltage starts to discontinuously increase as a whole in a voltage range in which the applied voltage is lower than the dielectric breakdown voltage satisfies a condition of an electric field strength of 3 [MV/cm] or more when the ratio of the total thickness of the predetermined number of tantalum oxide sublayers to the total thickness of the dielectric layer in the stacked layer structure is varied, and the ratio of the total thickness of the predetermined number of tantalum oxide sublayers to the total thickness of the dielectric layer is within a thickness ratio range such that the start voltage is within the range.

The capacitor is preferably provided as an element of an analog circuit in which analog alternating current signals are applied to at least one of the first electrode and the second electrode.

A liquid crystal display device according to an embodiment of the present invention includes a display unit in which a counter substrate is overlapped with a driving substrate for applying an electric field to liquid crystals, and the liquid crystals are filled in each pixel disposed between the two substrates. In a multilayer interconnection structure of the driving substrate of the liquid crystal display device, data lines, transistors that control the application of signals from the data lines to the liquid crystals, and holding capacitors that hold the voltage applied to the liquid crystals are provided. The holding capacitors each include a first electrode, a second electrode, and a dielectric layer provided between the first electrode and the second electrode, and the dielectric layer has a stacked layer structure including a predetermined number of hafnium oxide sublayers and a predetermined number of tantalum oxide sublayers. The number of sublayers, the materials of the sublayers, and the thicknesses of the sublayers in the stacked layer structure are determined so that the ratio of the total thickness of the predetermined number of tantalum oxide sublayers to the total thickness of the dielectric layer has a range in which, in voltage-leakage current characteristics showing the relationship between the voltage applied between the first electrode and the second electrode and the leakage current, a start voltage at which the slope of an increase in the current to an increase in the voltage starts to discontinuously increase as a whole in a voltage range in which the applied voltage is lower than the dielectric breakdown voltage satisfies a condition of an electric field strength of 3 [MV/cm] or more when the ratio of the total thickness of the predetermined number of tantalum oxide sublayers to the total thickness of the dielectric layer in the stacked layer structure is varied, and the ratio of the total thickness of the predetermined number of tantalum oxide sublayers to the total thickness of the dielectric layer is within a thickness ratio range such that the start voltage is within the range.

According to the above-described structures of the embodiments of the present invention, the ratio of the total thickness of a predetermined number of tantalum oxide sublayers to the total thickness of the dielectric layer including a predetermined number of hafnium oxide sublayers and the predetermined number of tantalum oxide sublayers satisfies the following conditions:

First, the ratio of the total thickness of the predetermined number of tantalum oxide sublayer to the total thickness of the dielectric layer has a thickness ratio range in which a start voltage satisfies a condition of an electric field strength of 3 [MV/cm] or more. Herein, the term "start voltage" means the following voltage: In voltage-leakage current characteristics showing the relationship between the voltage applied between a first electrode and a second electrode and the leakage current, a voltage at which the slope of an increase in the current to an increase in the voltage starts to discontinuously increase as a whole in a voltage range in which the applied voltage is lower than the dielectric breakdown voltage is referred to as start voltage.

Secondly, the ratio of the total thickness of the predetermined number of tantalum oxide sublayers to the total thickness of the dielectric layer is within the thickness ratio range in which the start voltage satisfies the condition of an electric field strength of 3 [MV/cm] or more.

That is, in the capacitor according to an embodiment of the present invention, the number of sublayers, the materials of the sublayers, and the thicknesses of the sublayers in the stacked layer structure of the dielectric layer are determined so as to satisfy these two conditions.

Accordingly, when the capacitor is used by applying a voltage between the first electrode and the second electrode, the start voltage maintains a high level, and thus the leakage current can be suppressed. In this case, the electric field strength is high; 3 [MV/cm] or more. Therefore, even when the applied voltage is increased, the leakage current is not increased.

Therefore, the unit capacitance (capacitance per unit area) is high accordingly.

According to the present invention, a capacitor having a high unit capacitance and a low leakage current density, and a device including the capacitor can be realized.

BRIEF DESCRIPTION OF THE DRAWINGS

FIG. 5 is a table showing changes in layer thickness in the case where the unit capacitance and the effective relative dielectric constant are varied;

FIGS. 6A to 6E are tables each showing changes in electric field strength in the case where the unit capacitance and the effective relative dielectric constant are varied;

FIG. 7 is an E-J plot graph in the case where the $Ta_2O_5$ sublayer thickness ratio is the same and the $HfO_2$ sublayer thickness is varied;

DESCRIPTION OF THE PREFERRED EMBODIMENTS

An embodiment of the present invention will now be described with reference to the drawings.

Basic Structure of Capacitor

Figure 1:
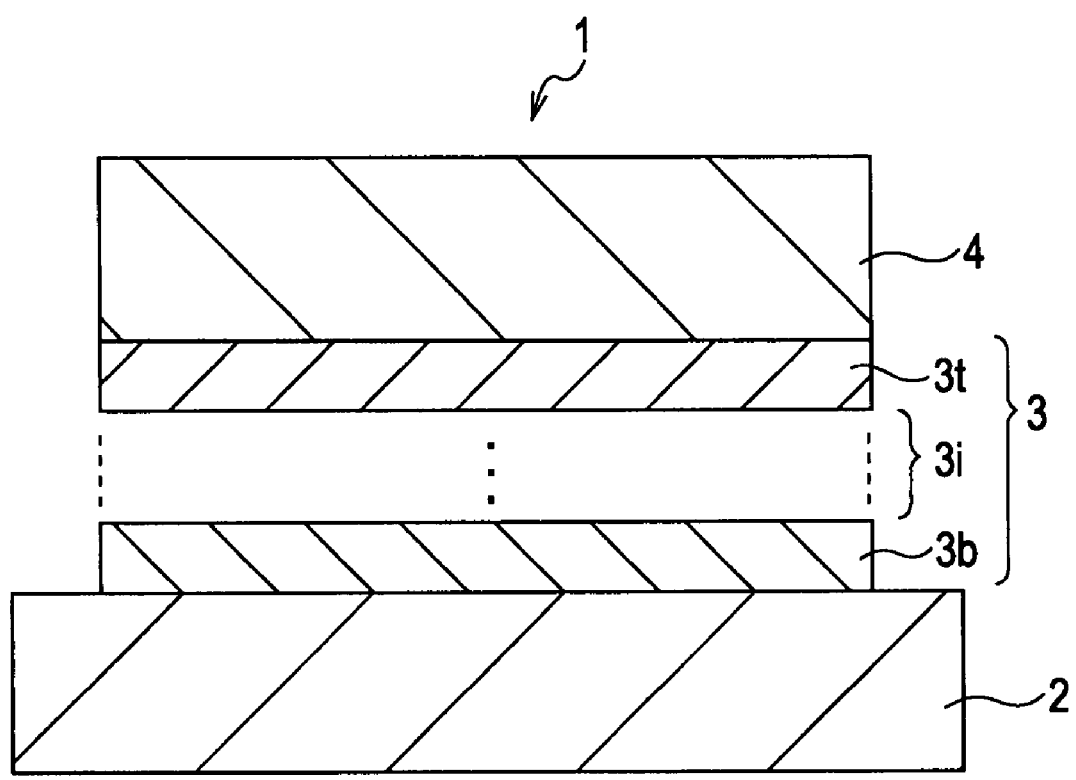
FIG. 1 is a cross-sectional view showing a basic structure of a capacitor of an embodiment of the present invention.

FIG. 1 shows a basic structure of a capacitor of this embodiment.

A capacitor 1 of this embodiment has a structure in which a first electrode 2, a dielectric layer 3, and a second electrode 4 are sequentially stacked, and the dielectric layer 3 has a stacked layer structure including a plurality of metal oxide sublayers.

The number of sublayers, and the material and the thickness of each sublayer in this stacked layer structure are determined from the viewpoint of a start voltage, as described in detail below.

An important feature of the stacked layer structure of the dielectric layer 3 is that a bottom dielectric sublayer 3b that is in contact with the first electrode 2 and a top dielectric sublayer 3t that is in contact with the second electrode 4 are each composed of a hafnium oxide ($HfO_2$) sublayer. An intermediate sublayer (intermediate dielectric sublayer 3i) may include a single metal oxide sublayer or a plurality of sublayers in which metal oxide sublayers made of different materials are alternately repeated. The sublayer structure of the intermediate dielectric sublayer 3i is not shown in FIG. 1 because the sublayer structure can be freely determined.

In a more preferable embodiment, the dielectric layer 3 has a stacked layer structure in which at least one set of stacked sublayers including a high dielectric sublayer made of a dielectric material having a relative dielectric constant higher than that of hafnium oxide and a hafnium oxide sublayer is repeatedly stacked on the hafnium oxide sublayer (bottom dielectric sublayer 3b), which is provided on the first electrode 2. The hafnium oxide sublayer that is lastly formed in this repeated formation constitutes the top dielectric sublayer 3t shown in FIG. 1.

Any one of tantalum oxide ($Ta_2O_5$), niobium oxide ($Nb_2O_5$), zirconium oxide ($ZrO_2$), and the like may be used as the dielectric material having a relative dielectric constant higher than that of hafnium oxide. In particular, $Ta_2O_5$, which has a higher relative dielectric constant, is preferred.

In order to obtain the advantages of the present invention, it is sufficient that the structure of the dielectric layer includes three sublayers. However, the number of sublayers is not limited thereto in embodiments, and the dielectric layer may be composed of a plurality of sublayers including three or more sublayers, for example, five sublayers or seven sublayers.

Descriptions will now be made of characteristics, parameters of the stacked layer structure, examples, and the like of the dielectric layer 3 having a three-layered structure in which hafnium oxide ($HfO_2$) sublayers are disposed on each side of a tantalum oxide ($Ta_2O_5$) sublayer.

As an even more preferable embodiment of the present invention, an MIM capacitor including a dielectric layer having a stacked layer structure of $HfO_2$—$Ta_2O_5$—$HfO_2$ is formed. This dielectric layer structure is a simple three-layer stacked structure and can be realized using a general deposition system for $HfO_2$ and $Ta_2O_5$, such as metal-organic chemical vapor deposition (MOCVD), plasma chemical vapor deposition (CVD), atomic layer deposition (ALD), sputtering, or the like.

In addition, "the ratio of the $Ta_2O_5$ sublayer thickness to the total dielectric layer thickness (hereinafter also referred to as "$Ta_2O_5$ sublayer thickness ratio") is set in the range of 0.05 to 0.45, and more preferably in the range of 0.2 to 0.45". More preferably, "the thickness of each of the $HfO_2$ sublayers is 1.6 [nm] (EOT: equivalent oxide thickness) or more". Herein, the equivalent oxide thickness is obtained by converting a layer thickness on the basis of the ratio of the relative dielectric constant of the layer to the relative dielectric constant of a silicon dioxide ($SiO_2$) layer.

The grounds for selecting the stacked layer structure and the structural parameters thereof in this even more preferable embodiment will now be described on the basis of various experimental results.

Dielectric Breakdown Characteristic of Single Sublayer

First, a description will be made of dielectric breakdown characteristics of a hafnium oxide ($HfO_2$) single sublayer and a tantalum oxide ($Ta_2O_5$) single sublayer.

Figure 2:
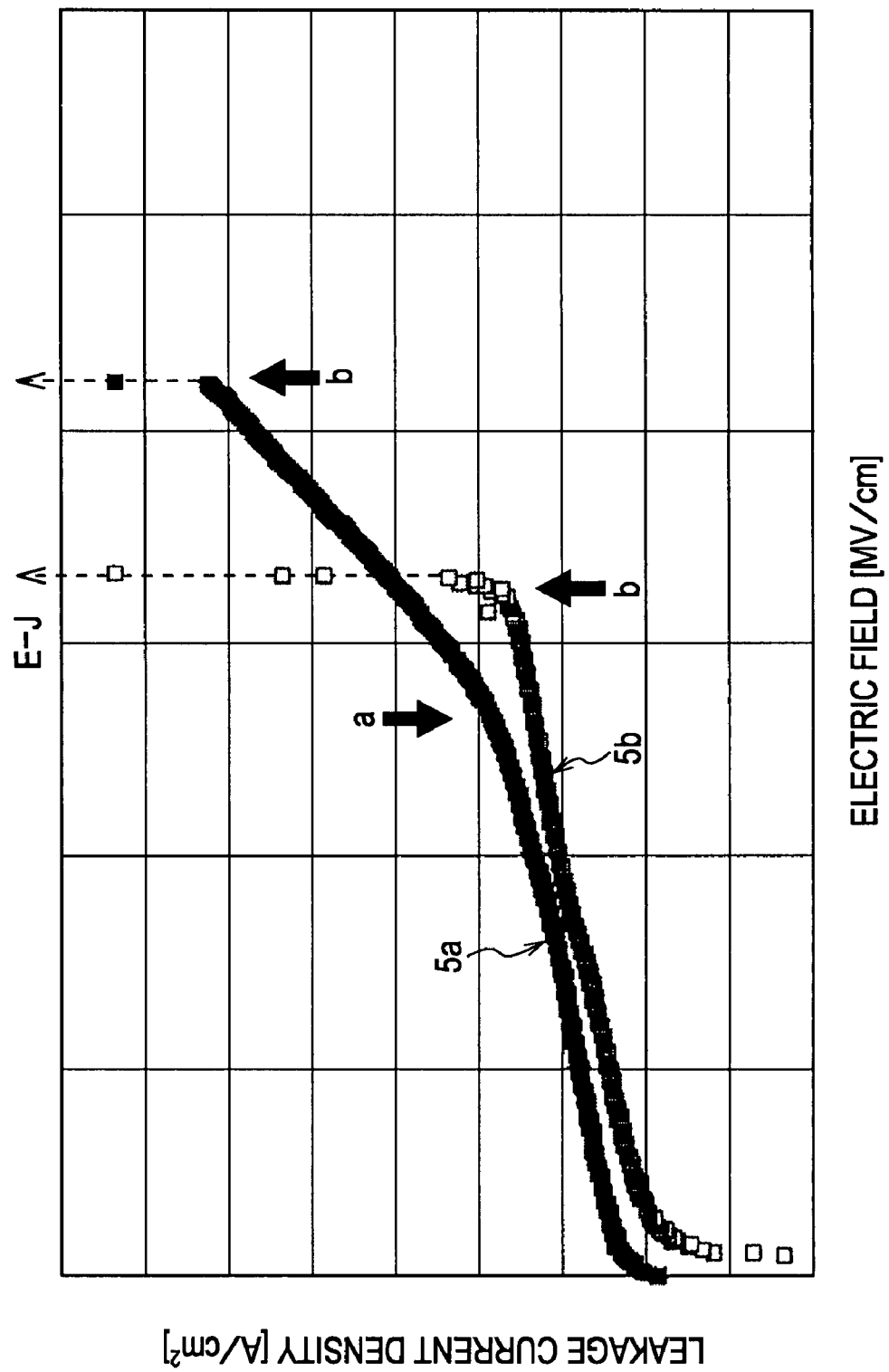
FIG. 2 is an E-J plot graph showing dielectric breakdown characteristics.

FIG. 2 shows the dielectric breakdown characteristics.

The vertical axis of FIG. 2 represents a leakage current density per unit area (unit: [A/cm], log scale), and the horizontal axis thereof represents the (vertical) electric field strength (unit: [MV/cm]) in the layer thickness direction. This dielectric breakdown characteristic graph is hereinafter referred to as "E (vertical electric field)-J (current density) characteristic" or "E-J plot".

In the figure, the curve shown by symbol "5a" is a dielectric breakdown characteristic curve (observed values) in a tantalum oxide ($Ta_2O_5$) single sublayer. The curve shown by symbol "5b" is a dielectric breakdown characteristic curve (observed values) in a hafnium oxide ($HfO_2$) single sublayer.

In the case of oxide layers of a metal such as tantalum (Ta) or niobium (Nb), since the free energy of formation of oxides of these metal materials is not particularly high, oxygen vacancies in the layer and impurities such as organic substances due to deposition materials contribute to electric conduction, and a current due to a PF conduction mechanism (PF current) flows from a range of a low electric field. This results in a degradation of the leakage current characteristics.

As shown in the characteristic curve 5a in FIG. 2, in the tantalum oxide ($Ta_2O_5$) single sublayer, the leakage current flows in the insulating layer from a low electric field, and the amount of leakage current is higher than that in the characteristic curve 5b of $HfO_2$ by several times to several orders of magnitude. The characteristic curve 5a of $Ta_2O_5$ has a slope-change point a from which the slope of the increase in the amount of current markedly increases over an electric field range higher than the slope-change point. This means that, among the previous leakage current mechanisms, the PF current starts to dominantly flow from the slope-change point a. When the electric field strength is further increased, the $Ta_2O_5$ single sublayer withstands breakdown up to a significantly high electric field. As shown by the broken line in the figure, point b at which the leakage current density markedly increases is a dielectric breakdown point. The slope-change point a represents the "PF-current-start voltage (or electric field)" defined above.

On the other hand, metal oxide layers such as $Al_2O_3$, $HfO_2$, and $ZrO_2$ layers whose impurity content is low and whose composition is close to the stoichiometric ratio have a low level of leakage current but show characteristics that they are more susceptible to dielectric breakdown than tantalum oxide ($Ta_2O_5$).

As shown by the characteristic curve 5b of $HfO_2$ in FIG. 2, when the electric field is increased, the $HfO_2$ single sublayer maintains very satisfactory leakage current characteristics even after the electric field strength exceeds the slope-change point a at which the PF current becomes dominant in the characteristic curve 5a of $Ta_2O_5$. This is because the PF current does not flow in the $HfO_2$ single sublayer, and thus, a marked increase in the current does not occur.

However, after the electric field strength exceeds the slope-change point a, dielectric breakdown (point b) occurs at a relatively low electric field strength. As described above, hafnium oxide ($HfO_2$) has a characteristic of low leakage current but is susceptible to dielectric breakdown. This breakdown voltage changes depending on the layer thickness. However, in layers composed of the same material, the breakdown voltage is substantially determined as a constant value in terms of the electric field. In the case of $HfO_2$, a breakdown voltage of about 2.5 [MV/cm] is obtained.

As described above, in the case of $Ta_2O_5$, the PF current flows, and the breakdown withstand voltage is high accordingly. In contrast, $Al_2O_3$, $HfO_2$, $ZrO_2$, and the like have a reverse characteristic that they are subjected to breakdown in a low electric field range because the PF current does not flow.

The stacked layer structure of a capacitor dielectric layer according to the even more preferable embodiment of the present invention combines the advantages of these sublayers and compensates for the shortcomings of the sublayers, and specifically defines a stacked layer structure of $HfO_2$ and $Ta_2O_5$ by structural parameters such as the layer thickness ratio.

Structural Parameters of Stacked Layers

Next, parameters specifying the stacked layer structure of the dielectric layer 3 shown in FIG. 1 will be described.

Figure 3:
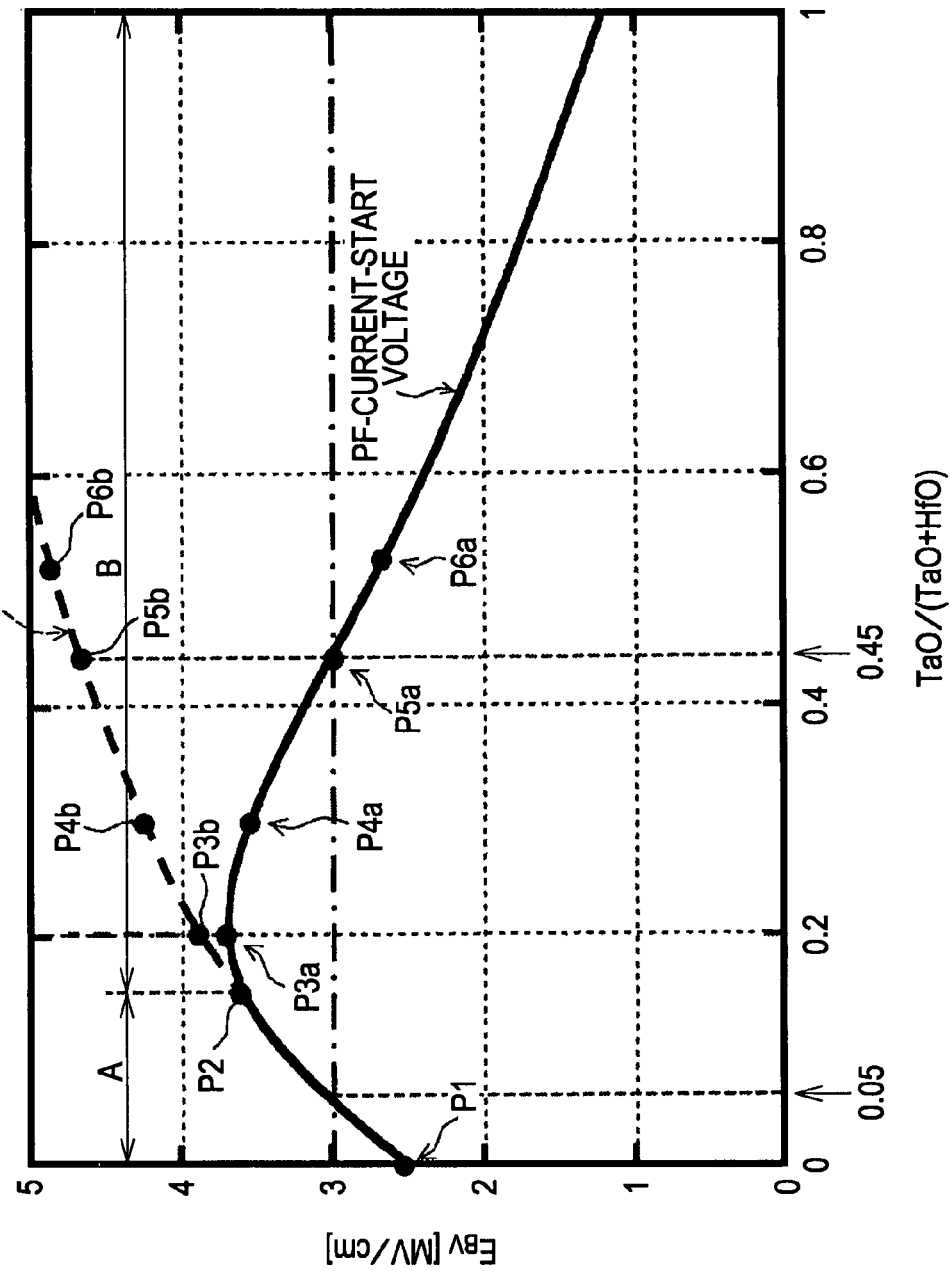
FIG. 3 is a graph showing the relationship between the $Ta_2O_5$ sublayer thickness ratio and the electric fields at the breakdown withstand voltage and the PF-current-start voltage.

FIG. 3 is a graph plotting the ratio of the $Ta_2O_5$ sublayer (intermediate dielectric sublayer 3i) thickness to the total dielectric layer thickness and the electric fields at the breakdown withstand voltage and at PF-current-start voltage in a structure of $HfO_2$ (top dielectric sublayer 3t)-$Ta_2O_5$ (intermediate dielectric sublayer 3i)-HfO$_2$ (bottom dielectric sublayer 3b). The strength of these electric fields is shown by "E$_{BV}$" in the figure because the strength of these electric fields is related to the breakdown voltage.

In the figure, the broken line represents the breakdown withstand voltage (dielectric breakdown voltage), and the solid line represents the PF-current-start voltage. Herein, the term "PF-current-start voltage" represents the electric field strength at point a at which the slope of the leakage current changes in FIG. 2.

In FIG. 3, the PF-current-start voltage is shown to increase as the ratio of the Ta$_2$O$_5$ sublayer thickness to the total thickness of the dielectric layer 3 increases. As described below, in this range (range A), since the breakdown withstand voltage is dominant, the breakdown withstand voltage and the curve of the PF-current-start voltage are shown overlapping each other. In a range (range B) in which the above thickness ratio is higher than that in range A, the PF-current-start voltage starts to decrease from a certain point (pole) P3a.

On the other hand, the electric field at the breakdown withstand voltage increases as the ratio of the Ta$_2$O$_5$ sublayer thickness to the total thickness of the dielectric layer 3 increases. When the PF-current-start voltage is high, the total leakage current level is low, and this is effective for decreasing the leakage current. Furthermore, the electric field at the breakdown withstand voltage is also preferably as high as possible. However, even when the electric field at the breakdown withstand voltage is high, if the PF-current-start voltage is low, the total leakage current level is high, which is not preferred.

In this embodiment, the optimum range in which the PF-current-start voltage and the breakdown withstand voltage are balanced is specified by focusing attention on a range where the PF-current-start voltage has a local maximum value.

In FIG. 3, points P1, P2, P3a, P3b, P4a, P4b, P5a, P5b, P6a, and P6b in the curves of the PF-current-start voltage and the breakdown withstand voltage are shown.

Figure 4:
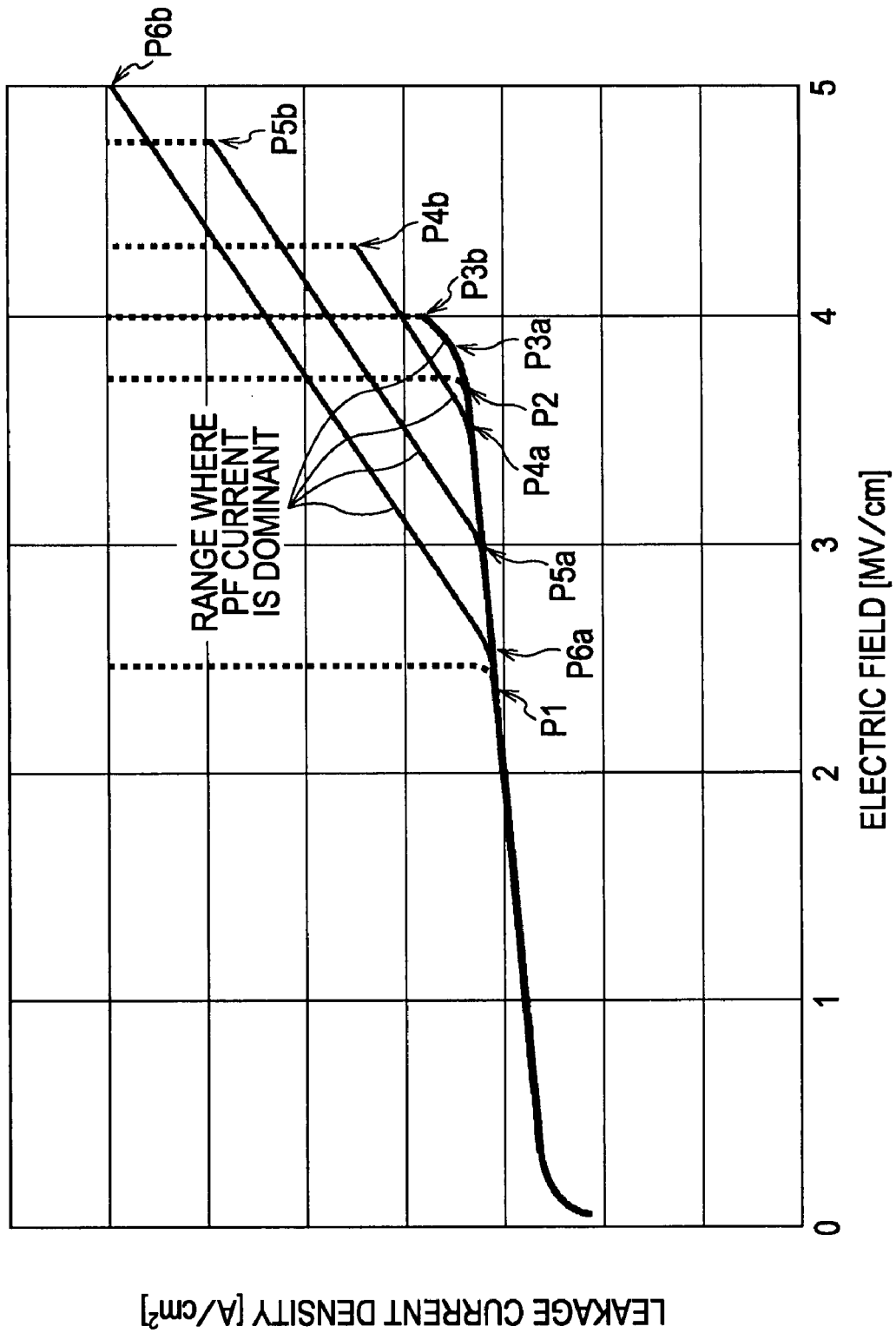
FIG. 4 is a graph showing the relationship between the electric field and the current (leakage current density)

FIG. 4 shows characteristic curves showing the relationship between the electric field strength having a PF-current-start voltage or a breakdown withstand voltage at the above-mentioned ten points and the current (leakage current density) so that the curves overlap each other.

The relationship between the ratio of the Ta$_2$O$_5$ sublayer thickness to the total thickness of the dielectric layer 3 and the electric field strength E$_{BV}$ will now be described with reference to FIGS. 3 and 4.

In FIG. 3, point P1 shows the case of a hafnium oxide single sublayer (in which the ratio of the Ta$_2$O$_5$ sublayer thickness to the total thickness of the dielectric layer 3 is zero). In this case, as shown in FIG. 4, dielectric breakdown occurs at point P1, and the PF-current-start voltage is not present. This is because dielectric breakdown occurs before the PF current starts to increase. As shown in FIG. 3, when the Ta$_2$O$_5$ sublayer thickness ratio is increased from point P1, a range (range A) in which this dielectric breakdown is dominant and the PF-current-start voltage does not appear as a characteristic is continued up to point P2 at which the ratio is about 0.15. Accordingly, the curve having point P2 shown in FIG. 4 has a shape in which the breakdown withstand voltage of the curve having point P1 is shifted in a direction in which the breakdown withstand voltage is increased.

As shown in FIG. 3, when the Ta$_2$O$_5$ sublayer thickness ratio is further increased from point P2, the curve of the breakdown withstand voltage shown by the broken line and the curve of the PF-current-start voltage shown by the solid line are separated from each other from point P2 serving as a boundary point. More specifically, the breakdown withstand voltage monotonically increases, whereas the PF-current-start voltage reaches a peak at point P3a and then monotonically decreases.

As seen in FIG. 4, in the curve in which the above ratio is somewhat higher than the curve having point P2, a PF-current-start voltage P3a appears, and the curve also has a breakdown withstand voltage P3b higher than the voltage P3a. The substantially linear range joining the PF-current-start voltage P3a and the breakdown withstand voltage P3b is a range where the PF current is dominant.

As the above ratio is further increased, the breakdown withstand voltage gradually increases to points P4b, P5b, and P6b, whereas the PF-current-start voltage gradually decreases to points P4a, P5a, and P6a. Referring to FIG. 4, as a result, the substantially linear range where the PF current is dominant gradually expands to a wider range.

The range (B range) in which the above ratio is higher than that at point P2 is preferred from the viewpoint of high breakdown withstand voltage, but the PF current increases in this range. Accordingly, the characteristics of the layer are degraded from the latter viewpoint. It is sufficient that the breakdown withstand voltage satisfies a level of a certain desired electric field strength. In contrast, as the value of the PF-current-start voltage decreases, the leakage current at the above desired electric field strength undesirably increases. Consequently, range B is a range in which the PF-current-start voltage mainly affects the layer characteristics.

In this embodiment, a preferable layer thickness ratio is specified as follows: "The ratio of the Ta$_2$O$_5$ sublayer thickness to the total dielectric layer thickness is in the range of 0.0.5 to 0.45". This is because 3 [MV/cm] or more is satisfied as an example of the value of "the desired electric field strength" in FIG. 3.

The reason that the desired electric field strength is 3 [MV/cm] or more will now be described.

FIG. 5 shows the relationship of the layer thickness for realizing each capacitance per unit area (unit capacitance Cdens) in each effective relative dielectric constant ∈ of a dielectric layer 3. FIGS. 6(A) to 6(E) show the electric field strengths (unit: [MV/cm]) in a direction of the dielectric layer thickness in the case where the unit capacitance (Cdens) and the effective relative dielectric constant ∈ of a dielectric layer 3 are varied. FIG. 6(A) shows the case of a power supply voltage of 3.3 [V], FIG. 6(B) shows the case of a power supply voltage of 5 [V], FIG. 6(C) shows the case of a power supply voltage of 6.6 [V], FIG. 6(D) shows the case of a power supply voltage of 7 [V], and FIG. 6(E) shows the case of a power supply voltage of 13.2 [V].

In general electronic devices and portable devices, a power supply voltage of 3 [V] is widely used. When a margin of the breakdown withstand voltage, such as noise, is included under the condition of this power supply voltage, it is necessary to ensure the same characteristics as those in the case where a voltage about two times the power supply voltage, i.e., a power supply voltage in the range of about 6 to 7 [V] is applied.

Currently desired unit capacitance Cdens is in the range of about 6 to 8 [fF/μm$^2$]. An effective (or average) relative dielectric constant ∈ in the structure of HfO$_2$ (top dielectric sublayer 3t)-Ta$_2$O$_5$ (intermediate dielectric sublayer 3i)-HfO$_2$ (bottom dielectric sublayer 3b) is in the range of 20 to 24. Here, a case where the highest unit capacitance Cdens of 8 [fF/μm$^2$] is realized as a goal at a relative dielectric constant ∈ of 20, in which the realization of a high-density capacitance is the most difficult, is focused on. In this case, in order to ensure the same characteristics as those in the case where a voltage about two times the power supply voltage is applied, as is apparent from FIGS. 6(C) and 6(E), it is necessary to ensure an electric field strength of 3 [MV/cm] or more.

This is the reason why the structural parameters are specified as an electric field strength of 3 [MV/cm] or more.

In this embodiment, a more preferable layer thickness ratio is specified as follows: "The ratio of the $Ta_2O_5$ sublayer thickness to the total dielectric layer thickness is in the range of 0.2 to 0.45". The reason for this is as follows. In the graph shown in FIG. 3, in both the range from the point at which the above ratio is 0.05 to point P3a at which the PF-current-start voltage reaches a peak and the range from point P3a to point P5a, a desired electric field strength of 3 [MV/cm] or more is satisfied. However, the latter range from point P3a to point P5a is more preferable because the breakdown withstand voltage is higher than that in the former range. Alternatively, another more preferable range of the layer thickness ratio can be specified so that point P3a at which the PF-current-start voltage reaches a peak is disposed at the center.

As described above, in this embodiment, both the breakdown voltage and the suppression of the PF current can be balanced at a high level by specifying the range of the above ratio on the basis of the PF-current-start voltage.

Next, a condition for "the layer thickness of $HfO_2$" and a reason thereof will be described.

In a $HfO_2$ layer whose impurity content is low and whose composition is close to the stoichiometric ratio, there is a limit of the thickness in which the above-described characteristics can be maintained. The limit of the layer thickness of $HfO_2$ is 1.6 [nm] in terms of EOT (EOT: equivalent oxide thickness).

FIG. 7 is an E-J plot graph of three capacitors each having the same ratio of the $Ta_2O_5$ sublayer thickness to the total dielectric layer thickness of 0.3 and including $HfO_2$ sublayers, i.e., a top dielectric sublayer 3t and a bottom dielectric sublayer 3b, having a thickness of 1.5, 2.0, or 3.0 [nm] in terms of EOT.

Referring to the figure, when the thicknesses of the $HfO_2$ sublayers are 2.0 [nm] (EOT) and 3.0 [nm] (EOT), an increase in the leakage current is not observed. In contrast, when the thickness of each of the $HfO_2$ sublayers is 1.5 [nm] (EOT), the PF-current-start voltage is decreased from about 3 [MV/cm] to about 2.2 [MV/cm] in terms of the electric field. Accordingly, the leakage current density is markedly increased, and a condition that "the leakage current density is $1\times10^{-7}$ [A/cm$^2$] or less at an electric field of 3 [MV/cm]", which is a criterion for determining whether or not the leakage current density is within an acceptable range, is not satisfied.

Although not shown in the figure, experimental results showed that, when the thickness of each of the $HfO_2$ sublayers was 1.6 [nm] (EOT), a decrease in the PF-current-start voltage was observed, but this thickness of each of the $HfO_2$ sublayers of 1.6 [nm] (EOT) was the limit in which desired leakage current characteristics could be obtained.

As described above, by suppressing dielectric breakdown due to $HfO_2$ and suppressing a decrease in the PF-current-start voltage due to $Ta_2O_5$, a leakage current density of $1\times10^{-7}$ [A/cm$^2$] or less and a high breakdown withstand voltage characteristic of 3 [MV/cm] or more can be realized while an increase in the leakage current is prevented and a high unit capacitance of 6 [fF/μm$^2$] or more is maintained.

Furthermore, as is apparent from FIG. 3, when the ratio of the $Ta_2O_5$ sublayer thickness to the total dielectric layer thickness is set in the range of 0.2 to 0.45, the breakdown withstand voltage can be improved to about 3.7 [MV/cm] or more without causing a decrease in the PF-current-start voltage due to $Ta_2O_5$.

More specific examples will now be described.

Example 1

In the case where the relative dielectric constants of $Ta_2O_5$ and $HfO_2$ are 24 and 21, respectively, and a capacitor having a unit capacitance of, for example, 8 [fF/μm$^2$] is formed, when the ratio of the $Ta_2O_5$ sublayer thickness to the total dielectric layer is 0.15, the thicknesses of sublayers composed of $HfO_2$, $Ta_2O_5$, and $HfO_2$ are approximately determined to 10, 3.5, and 10 [nm], respectively. In the above case, when the $Ta_2O_5$ sublayer thickness ratio is about 0.3, similarly, the thickness of each of the sublayers is approximately determined to be 8 [nm]. In this case, since the thickness of each of the $HfO_2$ sublayers corresponds to 1.5 [nm] in terms of EOT, the above-described condition of "1.6 [nm] (EOT) or more" is not satisfied, which is not desirable.

Dielectric layers 3 having the above two types of sublayer-thickness structures were formed, and the E-J characteristics thereof were evaluated. The results are shown in FIG. 8.

A capacitor having a dielectric layer structure of $HfO_2$—$Ta_2O_5$—$HfO_2$ in which the $Ta_2O_5$ sublayer thickness ratio was about 0.15 and the thickness of each of the $HfO_2$ sublayers was 1.9 [nm] in terms of EOT was prepared. The characteristic of this capacitor is shown by "HTH=10:3.5:10 nm" in FIG. 8.

Figure 8:
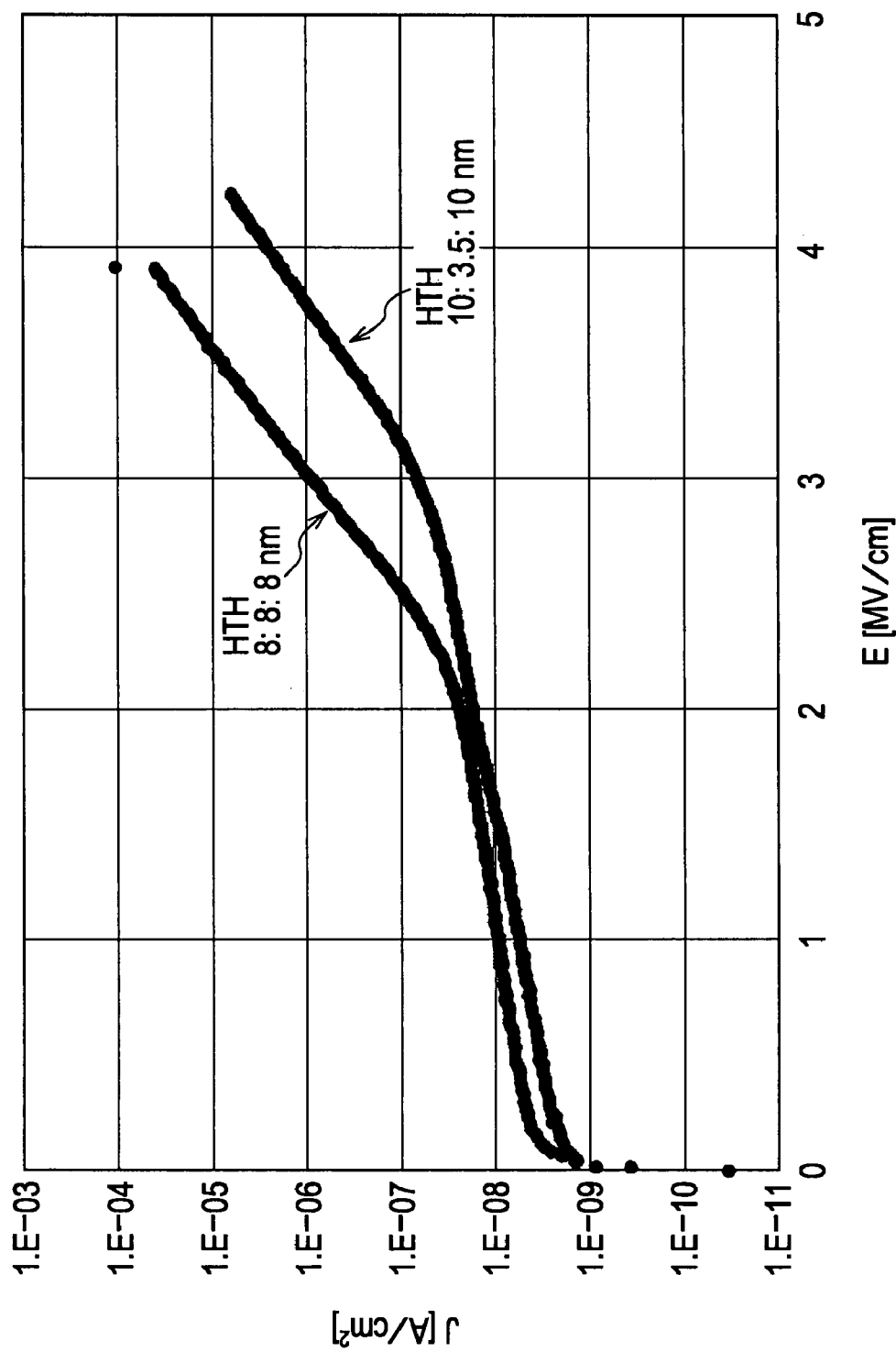
FIG. 8 is an E-J plot graph of Example 1.

The characteristic of a capacitor shown by "HTH=8:8:8 nm" in FIG. 8 is the characteristic of a capacitor having the same dielectric layer structure as that of the capacitor shown by "HfO: 1.5 nm (EOT)" in FIG. 7.

Referring to the results shown in FIG. 8, the following was confirmed: Even when the sublayer thickness ratio shown in FIG. 3 was out of the most preferable range of 0.2 to 0.45, in the case where the sublayer thickness ratio was within the preferable range of 0.05 to 0.45 and the thickness of each of the $HfO_2$ sublayers was 1.6 [nm] or more in terms of EOT, a high unit capacitance of 8 [fF/μm$^2$] could be realized with a breakdown withstand voltage of 3 [MV/cm] or more and a low leakage current density of $1\times10^{-7}$ [A/cm$^2$] or less at 3 [MV/cm].

Example 2

In Example 2, capacitors having the same relative dielectric constants as those in Example 1 and a unit capacitance of, for example, 6 [fF/μm$^2$] are formed. In this case, when 0.3 is selected as the $Ta_2O_5$ sublayer thickness ratio, the thicknesses of $HfO_2$ (top dielectric sublayer 3t), $Ta_2O_5$ (intermediate dielectric sublayer 3i), and $HfO_2$ (bottom dielectric sublayer 3b) are approximately determined to 11, 10, and 11 [nm], respectively.

A dielectric layer 3 having the above sublayer-thickness structures was formed, and the E-J characteristic thereof was evaluated. The result is shown in FIG. 9.

Figure 9:
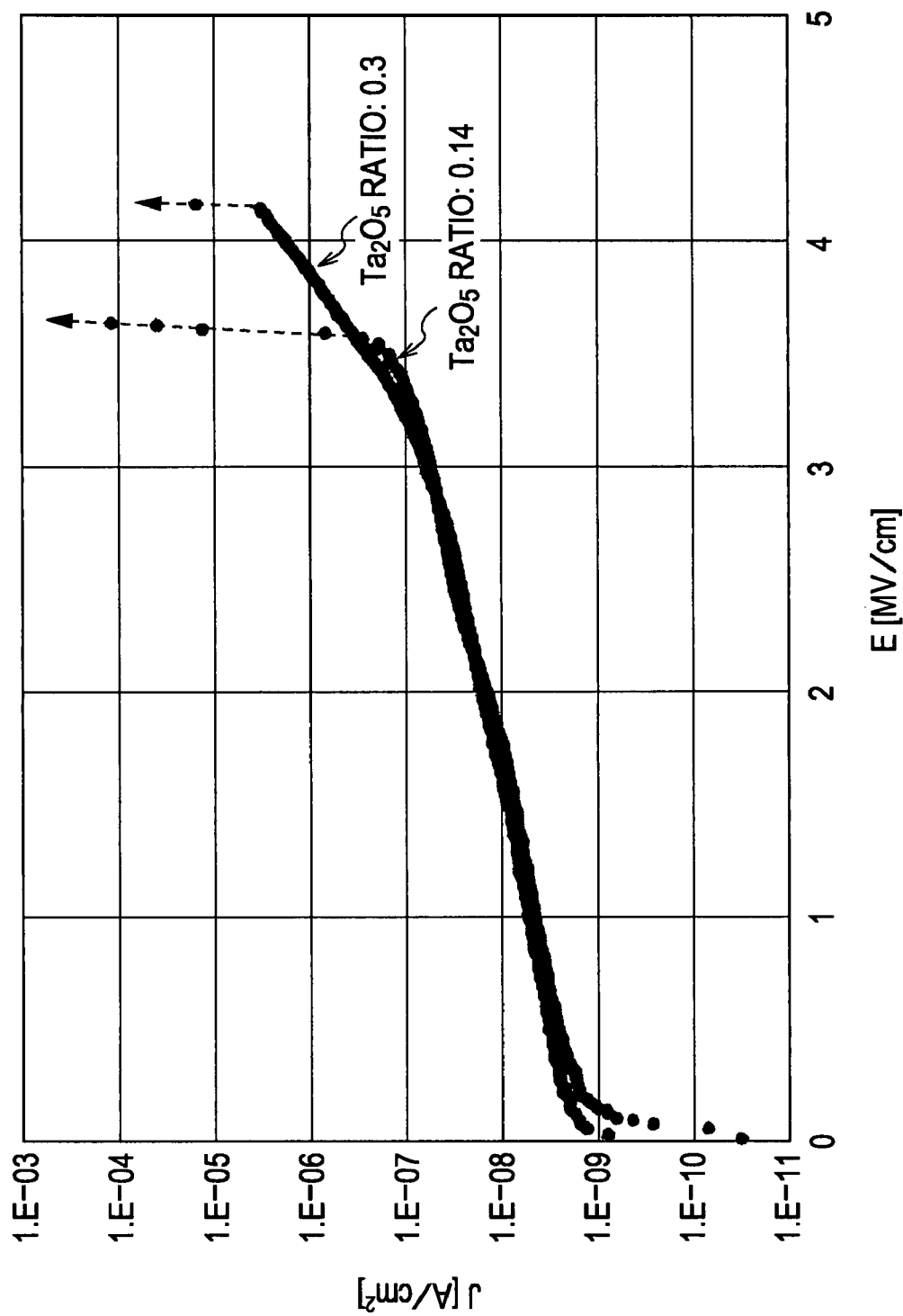
FIG. 9 is an E-J plot graph of Example 2.

In FIG. 9, the characteristic of this capacitor with "HTH=11, 10, 11 [nm]" is shown by "$Ta_2O_5$ ratio: 0.3". In this characteristic, although the PF-current-start voltage was about 3 [MV/cm], the breakdown withstand voltage was more than 4 [MV/cm].

In contrast, regarding the characteristic of a capacitor that has a $Ta_2O_5$ sublayer thickness ratio of 0.14 while the same unit capacitance was aimed for, although the PF-current-start voltage exceeded 3 [MV/cm], breakdown occurred at 3.5 [MV/cm].

As described above, even when the unit capacitance was the same, by appropriately selecting the $Ta_2O_5$ sublayer thickness ratio, the breakdown withstand voltage could be further improved without degrading the leakage current characteristics.

The results of Example 2 showed that the breakdown withstand voltage could be further improved when the $Ta_2O_5$ sublayer thickness ratio was within the most preferable range of 0.2 to 0.45.

In Examples 1 and 2, combinations of the sublayer thicknesses can be freely determined, and the thicknesses of the top and bottom $HfO_2$ sublayers sandwiching the $Ta_2O_5$ sublayer need not necessarily be the same as long as the condition that "the ratio of the $Ta_2O_5$ sublayer thickness to the total dielectric layer thickness is set in the range of 0.05 to 0.45, and more preferably in the range of 0.2 to 0.45, and the thickness of each of the $HfO_2$ sublayers is 1.6 [nm] (EOT: equivalent oxide thickness) or more" is satisfied.

For example, in order to prevent damage caused during the formation of a top electrode, it is effective that the upper $HfO_2$ sublayer (top dielectric sublayer 3t) is formed so as to have a thickness larger than that of the lower $HfO_2$ sublayer. In such a case, when the condition that the above $Ta_2O_5$ sublayer thickness ratio is set in the range of 0.05 to 0.45, and the thickness of each of the $HfO_2$ sublayers is 1.6 [nm] (EOT) or more is satisfied, the above-described satisfactory characteristics can be obtained.

In this embodiment, the reason that the above-described satisfactory characteristics can be obtained is that, first, as shown in FIG. 1, both the dielectric sublayer that is in contact with the first electrode 2 and the dielectric sublayer that is in contact with the second electrode 4 are each composed of a $HfO_2$ sublayer. This is apparent from the fact that an increase in the leakage current is observed in a dielectric layer structure in which $Ta_2O_5$ is directly in contact with the electrodes.

This embodiment shows that when the above-described condition is satisfied in such a case, satisfactory characteristics can be obtained.

Two examples of a device application will be described below.

Example 3

Example 3 relates to a semiconductor device including a capacitor.

Figure 10:
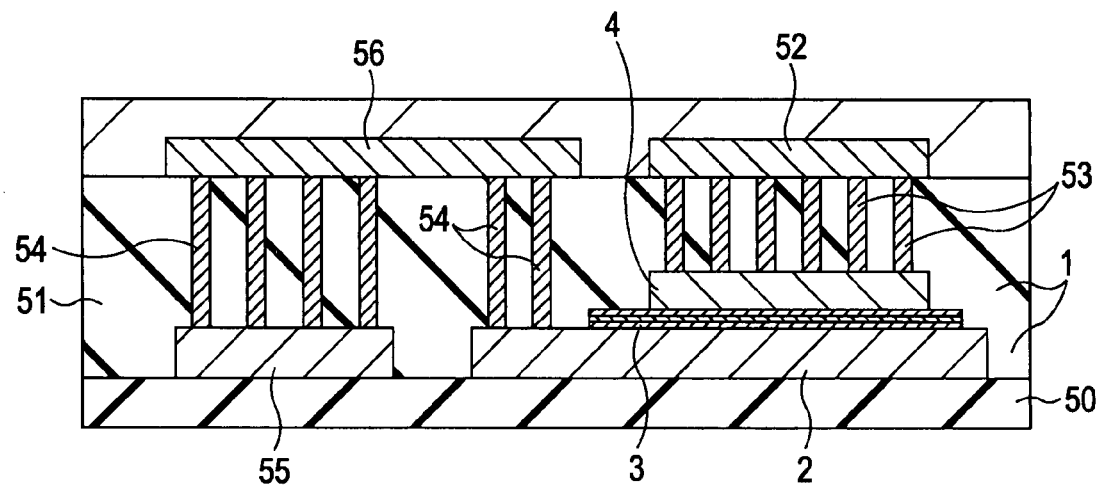
FIG. 10 is a cross-sectional view showing a device structure of Example 3.

FIG. 10 is a cross-sectional view showing an example of the structure near an MIM capacitor of a semiconductor device.

An MIM capacitor 1 including a dielectric layer 3 having the above-described stacked layer structure of $HfO_2$—$Ta_2O_5$—$HfO_2$ is provided on an insulating film 50 provided on a semiconductor substrate (or a substrate made of another material) (not shown). A first electrode 2 is provided on the insulating film 50, the dielectric layer 3 is provided on the first electrode 2, and a second electrode 4 is further provided on the dielectric layer 3.

An interlayer insulating film 51 is provided so as to cover the MIM capacitor 1. Upper layer wiring 52 connected to the second electrode 4 of the MIM capacitor 1 is provided on the interlayer insulating film 51. Connection between the upper layer wiring 52 and the second electrode 4 is established via plugs 53 in the interlayer insulating film 51. On the other hand, the first electrode 2 is connected to a conductive layer 55 that is composed of the same layer as the first electrode 2, and upper layer wiring 56 via other plugs 54.

This device portion is formed by, for example, the following method.

First, a first electrode 2 and a conductive layer 55 are formed on an insulating film 50 separately or as a single film. Clearances adjacent to the side faces of these layers are filled with an insulating material to planarize the surface, and the top surface of the first electrode 2 is then exposed. A dielectric layer 3 having the stacked layer structure according to an embodiment of the present invention is then formed thereon by sequentially depositing sublayers thereof.

The method of forming this dielectric layer 3 is not particularly limited. However, deposition is performed by, for example, atomic layer deposition (ALD), metal-organic chemical vapor deposition (MO-CVD), plasma-enhanced chemical vapor deposition (PE-CVD), plasma-enhanced atomic layer deposition (PE-ALD), or sputtering.

In this step, the deposition conditions are determined such that the content of the residual impurities is minimized and the composition is as close to the stoichiometric ratio as possible. In order to improve the layer quality, a heat treatment, an additional oxidation treatment, or the like may be performed as post-treatment. However, when a heat treatment induces crystallization of a metal oxide layer and this crystallization causes an increase in the leakage current, PE-CVD or PE-ALD, which does not need a heat treatment, is preferably employed as the deposition method.

Next, a second electrode 4 is deposited, and the electrode is then processed so as to have a desired size.

Next, the dielectric layer 3 is processed to remove unnecessary portions. Thus, the major portion of an MIM capacitor 1 is completed.

Subsequently, an interlayer insulating film 51 is formed, and the surface thereof is then planarized. Via holes for forming plugs 53 and 54 are formed in the interlayer insulating film 51. The formed via holes are filled with tungsten (W) or the like to form the plugs 53 and 54. Upper layer wirings 52 and 56 connected to the plugs 53 and 54, respectively, are formed on the interlayer insulating film 51. An insulating film or a protective film is formed thereon. Thus, the MIM capacitor portion is completed.

The materials of the first electrode 2 and the second electrode 4 are preferably titanium nitride (TiN) or tantalum nitride (TaN) in at least portions that are in contact with a $HfO_2$ sublayer. In particular, tantalum nitride (TaN) has a satisfactory affinity with $HfO_2$ sublayers, and thus tantalum nitride (TaN) is more preferable.

Example 3 shows an application of the MIM capacitor 1 including the dielectric layer 3 having dielectric sublayers with a stacked layer structure to a semiconductor device, and the structure and the method of forming the device are not limited to those described above. Any structure and method may be used in combinations except for the portion related to the structure of the capacitor shown in FIG. 1.

Since the semiconductor device having the exemplified structure shown in FIG. 10 includes the capacitor 1 of this embodiment, this semiconductor device is particularly suitable for an application for treating analog signals and an application for mixed signals that treats both analog signals and digital signals.

When the signals to be treated include analog signals, and analog signals having a large amplitude are applied to the capacitor 1 having the structure shown in FIG. 1, a unit capacitance having a high absolute value and a high accuracy, a satisfactory temperature-dependent characteristic of the capacitance, a high breakdown withstand voltage, a satisfactory insulating property in a high applied voltage range, and a satisfactory temperature-dependent characteristic to the insulating property are necessary.

Furthermore, a characteristic that is particularly necessary for an analog application is a satisfactory voltage dependency of capacitance.

Herein, the term "voltage dependency of capacitance" means the dependency of capacitance on input voltage when the voltage input to a capacitor is varied with a large amplitude. When this dependency is high, the capacitance varies in response to the effect of a change in the voltage. Accordingly, input analog signals are distorted during output. In contrast, when the voltage dependency of capacitance is low, analog signals with a large amplitude can be desirably output without distortion.

The voltage dependency of capacitance is determined by a measurement of voltage coefficient of capacitance (VCC). A smaller VCC means more satisfactory voltage dependency of capacitance. The VCC is inversely proportional to the absolute layer thickness T of the dielectric layer 3 (see FIG. 1) of a capacitor. Accordingly, a larger absolute layer thickness T can decrease VCC, thereby improving the voltage dependency of capacitance.

In an embodiment of the present invention, hafnium oxide ($HfO_2$) is used for the top dielectric sublayer 3*t* and the bottom dielectric sublayer 3*b* in FIG. 1, and tantalum oxide ($Ta_2O_5$) is contained in the intermediate dielectric sublayer 3*i*. In this combination of two metal oxide sublayers made of $HfO_2$ and $Ta_2O_5$, the relative dielectric constants $\in$ of these two materials are high; i.e., exceed 20. Therefore, the absolute layer thickness T of the capacitor 1 can be increased, which is advantageous in that the VCC can be decreased accordingly. Consequently, the capacitor 1 in which these materials are used in combination is suitable for an analog application and a mixed signal application.

Example 4

Example 4 describes an application of a capacitor 1 to a liquid crystal display.

Figure 11:
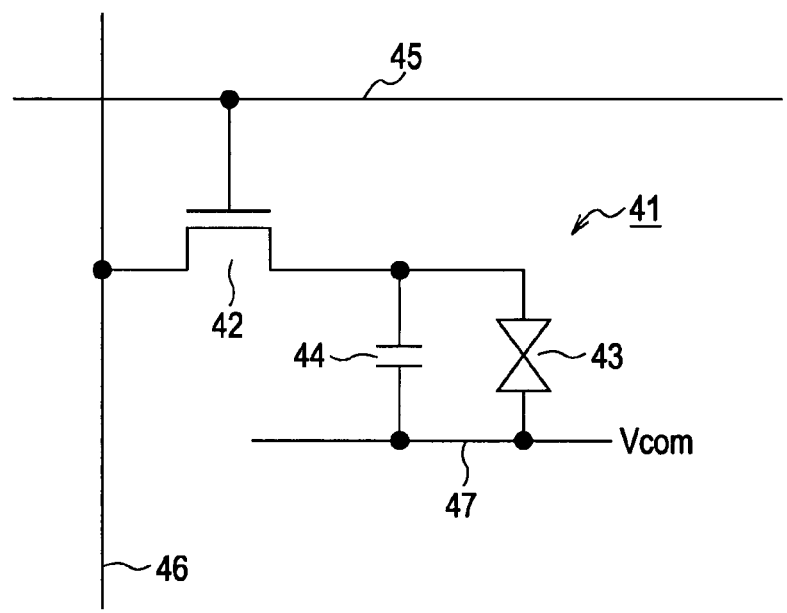
FIG. 11 is a circuit diagram of a liquid crystal pixel of Example 4.

FIG. 11 is a circuit diagram showing an example of the configuration of a pixel circuit of a liquid crystal display.

Pixels 41 are two-dimensionally arrayed in a matrix manner on a liquid crystal display panel (not shown). The liquid crystal display panel is prepared by interposing a liquid crystal substance layer between a pair of (two) substrates. The principal portions of the pixels 41 are formed in a multilayer interconnection structure of an array substrate among the two substrates.

Each of the pixels 41 includes a thin-film transistor (TFT) 42, a liquid crystal cell 43 connected to the drain of the TFT 42, and a storage capacitor 44 an electrode of which is connected to the drain of the TFT 42. The TFT 42 controls switching of a pixel electrode of the liquid crystal cell 43. The gate of the TFT 42 is connected to a scanning line 45, and the source of the TFT 42 is connected to a data line 46.

The storage capacitor 44 is electrically connected to the pixel electrode of the liquid crystal cell 43 in order to maintain the electric potential of a signal voltage applied to the pixel electrode. A high unit capacitance is necessary for this storage capacitor 44. For this requirement, the storage capacitor 44 is configured to have the same capacitor structure as that shown in FIG. 1 to which the present invention is applied.

A counter electrode of the liquid crystal cell 43 and another electrode of the storage capacitor 44 are each connected to a common line 47. The common line 47 provides the counter electrode of the liquid crystal cell 43 and the other electrode of the storage capacitor 44 with a common voltage Vcom that is common to each of the pixels.

Figure 12:
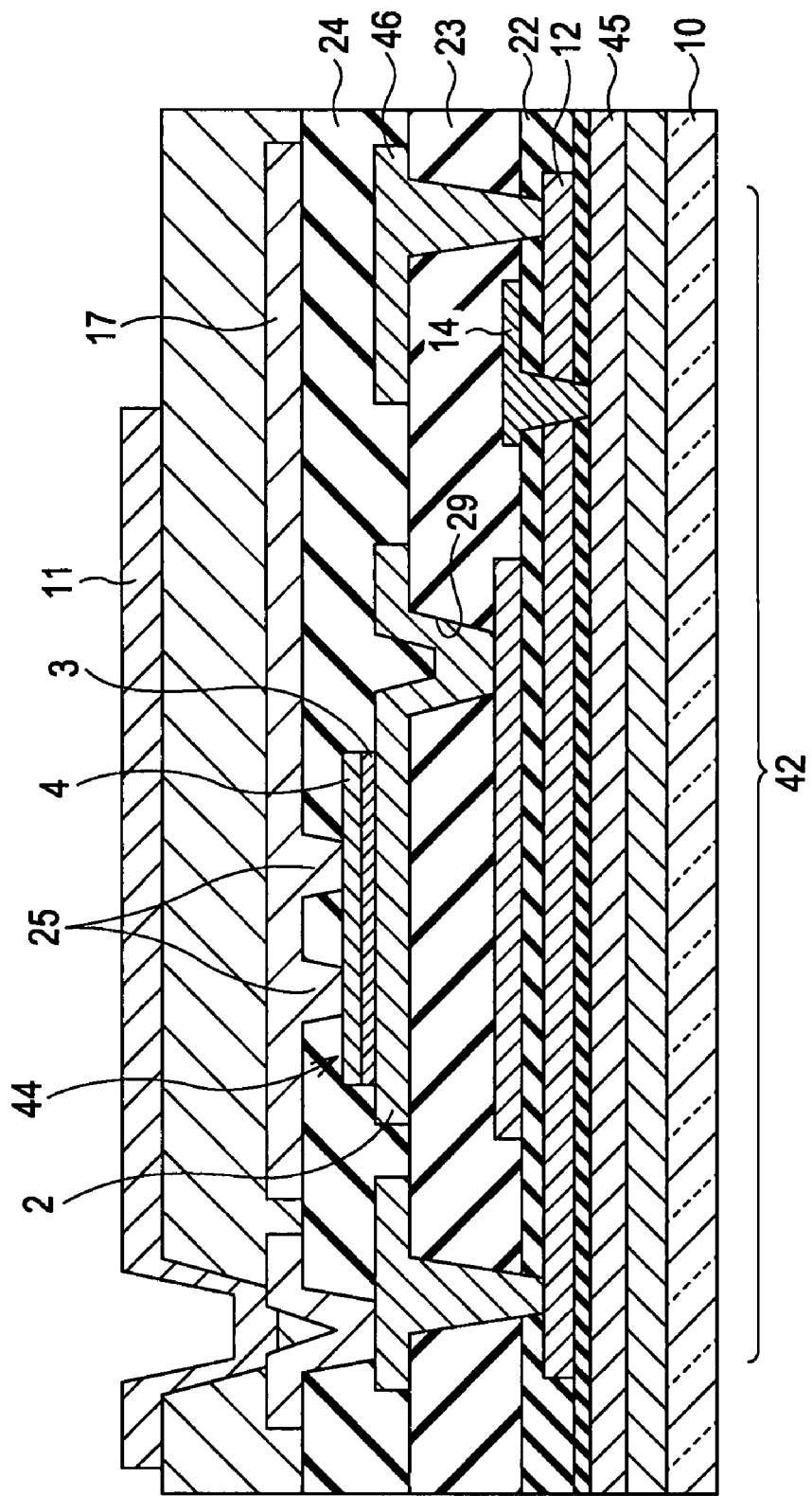
FIG. 12 is a cross-sectional view of an array substrate in a liquid crystal display device of Example 4.

FIG. 12 is a cross-sectional view of a part of an array substrate, the part including a storage capacitor 44.

An array substrate 10 is composed of, for example, a glass substrate, a quartz substrate, or a silicon substrate. A stacked layer structure including a storage capacitor 44, a scanning line 45, a data line 46, a pixel electrode 11, and the like, which are the same as those described above, are provided on the array substrate 10.

In this stacked layer structure, a first layer includes the scanning line 45, a second layer includes a semiconductor layer 12 included in a TFT 42, a third layer includes a gate electrode 14 of the TFT 42, and a fourth layer includes the data line 46 and the like.

Furthermore, a fifth layer includes a first electrode 2 of the storage capacitor 44, and a sixth layer includes a second electrode 4 of the storage capacitor 44. A dielectric layer 3 having the same layer structure as that shown in FIG. 1 is interposed between the first electrode 2 and the second electrode 4.

In this structure, the dielectric layer 3 is composed of three metal oxide sublayers having a stacked layer structure of $HfO_2$—$Ta_2O_5$—$HfO_2$ in that order from the bottom sublayer.

A seventh layer includes a fixed electrode layer 17, and an eighth layer includes the pixel electrode 11.

Next, a method of connecting the storage capacitor 44 will be described.

The gate electrode 14 of the TFT 42 is formed, and an interlayer insulating film 23 is then formed. Subsequently, a contact hole 29 is formed in the interlayer insulating film 23 and an interlayer insulating film 22 disposed thereunder. This contact hole 29 is formed at one time together with a contact hole of the data line 46.

A conductive film to be formed into the first electrode 2 is formed on the interlayer insulating film 23. This conductive film is preferably made of titanium nitride (TiN) or tantalum nitride (TaN) in at least a portion that is in contact with a $HfO_2$ sublayer. In particular, tantalum nitride (TaN) has a satisfactory affinity with the $HfO_2$ sublayer, and thus tantalum nitride (TaN) is more preferable. The contact hole 29 is sufficiently embedded during the formation of this conductive film.

The conductive film is then patterned to form the first electrode 2. In this step, the data line 46 is preferably formed at the same time in view of the process. However, in order to decrease the electrical resistivity, the data line 46 may be formed using another suitable material.

The dielectric layer 3 is deposited on the first electrode 2 by PE-ALD or the like as in Example 3. Furthermore, the second electrode 4 is deposited, and the electrode is then processed so as to have a desired size.

Subsequently, the dielectric layer 3 and the first electrode 2 are processed to remove unnecessary portions. Thus, the major portion of the storage capacitor 44 is completed.

Subsequently, deposition of an interlayer insulating film 24, formation of connectors 25, and deposition of the fixed electrode layer 17 are performed, thereby completing the connecting portion of the storage capacitor 44. Furthermore, the pixel electrode 11 and the like are formed as the eighth layer, thus completing the array substrate.

According to the embodiments of the present invention, an MIM capacitor that maintains a high unit capacitance and that has a high breakdown withstand voltage of 3 [MV/cm] or more and a high PF-current-start voltage can be formed using versatile materials such as $HfO_2$ and $Ta_2O_5$ with general-purpose equipment.

As a result, an application of a high-capacitance element to a high-power-supply-voltage device, a high-amplitude device, and the like can be expanded. Furthermore, reliability of the high-capacitance element, such as the electrostatic breakdown strength and a high resistance for plasma-induced damage (PID), can be improved.

It should be understood by those skilled in the art that various modifications, combinations, sub-combinations and alterations may occur depending on design requirements and other factors insofar as they are within the scope of the appended claims or the equivalents thereof.

What is claimed is:

1. A capacitor comprising:
a first electrode;
a dielectric; and
a second electrode that are sequentially stacked,
wherein the dielectric has a stacked layer structure including a predetermined number of hafnium oxide layers and at least one tantalum oxide layer, and
wherein a layer that is in contact with the first electrode and a layer that is in contact with the second electrode are each comprised of hafnium oxide; and
wherein a ratio of the combined total thickness of all tantalum oxide layers included in the dielectric to the total thickness of the dielectric is in the range of 0.2 to 0.45 and further wherein each of the hafnium oxide layers has a thickness of at least 1.6 nm equivalent oxide thickness and thicknesses of the hafnium oxide layers are not equal.

2. The capacitor according to claim 1, wherein at least one of the first electrode and the second electrode is comprised of titanium nitride (TiN) or tantalum nitride (TaN).

3. A semiconductor device comprising:
a semiconductor substrate;
at least one insulating film provided on the semiconductor substrate; and
a capacitor including a first electrode, a dielectric, and a second electrode that are sequentially stacked on the insulating film,
wherein the dielectric has a stacked layer structure including a predetermined number of hafnium oxide layers and at least one tantalum oxide layers, and
wherein a layer that is in contact with the first electrode and a layer that is in contact with the second electrode are each comprised of hafnium oxide; and
wherein a ratio of the combined total thickness of all tantalum oxide layers included in the dielectric to the total thickness of the dielectric is in the range of 0.2 to 0.45 and further wherein each of the hafnium oxide layers has a thickness of at least 1.6 nm equivalent oxide thickness and thicknesses of the hafnium oxide layers are not equal.

4. The semiconductor device according to claim 3, wherein the capacitor is provided as an element of an analog circuit in which analog alternating current signals are applied to at least one of the first electrode and the second electrode.

5. The semiconductor device according to claim 3, wherein at least one of the first electrode and the second electrode is comprised of titanium nitride (TiN) or tantalum nitride (TaN).

* * * * *